(12) United States Patent
Kaul et al.

(10) Patent No.: US 7,913,101 B2
(45) Date of Patent: Mar. 22, 2011

(54) METHOD AND APPARATUS FOR TREATING A SIGNAL

(75) Inventors: Himanshu Kaul, Portland, OR (US); Jae-sun Seo, Ann Arbor, MI (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 934 days.

(21) Appl. No.: 11/824,410

(22) Filed: Jun. 29, 2007

(65) Prior Publication Data

US 2009/0003428 A1 Jan. 1, 2009

(51) Int. Cl.
G06F 1/12 (2006.01)

(52) U.S. Cl. ........ 713/401; 713/400; 713/501; 375/360; 375/362

(58) Field of Classification Search .......... 713/400, 713/401, 501; 375/360, 362
See application file for complete search history.

(56) References Cited

U.S. PATENT DOCUMENTS

| | | | |
|---|---|---|---|
| 4,034,276 A * | 7/1977 | Hyatt | 318/608 |
| 4,132,939 A * | 1/1979 | Kameyama et al. | 318/627 |
| 7,154,300 B2 | 12/2006 | Anders et al. | |
| 7,190,651 B2 * | 3/2007 | Gushima et al. | 369/59.12 |
| 7,459,915 B2 * | 12/2008 | Chiba et al. | 324/617 |

OTHER PUBLICATIONS

Kaul et al., "Spatial Encoding Circuit Techniques for Peak Power Reduction of On-Chip High-Performance Buses", Proc. International Symposium on Low Power Electronics and Design (ISLPED), pp. 194-199, Aug. 2004.
Kaul et al., "Performance Optimization of Critical Nets through Active Shielding", IEEE Transactions on Circuits and Systems-I, vol. 51, pp. 2417-2435, Dec. 2004.
Kaul, "High-Performance On-Chip Interconnect Circuit Technologies for sub-65nm CMOS", Proc. IEEE International System-On-a-Chip Conference (SOCC), pp. 324, Sep. 2005.
Anders et al., "A Transition-Encoded Dynamic Bus Technique for High-Performance Interconnects", IEEE Journal Solid State Circuits, vol. 38, pp. 709-714, May 2003.

* cited by examiner

*Primary Examiner* — Thuan N Du
(74) *Attorney, Agent, or Firm* — Schwabe, Williamson & Wyatt, P.C.

(57) ABSTRACT

A method includes: delaying an excursion of at least one signal a first number of clock phases when the excursion departs from a value in a first direction; and delaying the excursion of the at least one signal a second number of the clock phases when the excursion departs toward the value in a second direction. The first number of clock phases is different from the second number of clock phases. The at least one signal effects a plurality of succeeding excursions in substantial synchrony with a clocked signal presenting succeeding clock cycles having a plurality of the clock phases in each respective clock cycle.

16 Claims, 4 Drawing Sheets

METHOD AND APPARATUS FOR TREATING A SIGNAL

BACKGROUND

The increased integration of multiple-cores and large shared caches in microprocessors may require improved energy-efficiency for core-to-core, core-to-cache and intra-core communication to sustain desired performance benefits within shrinking power envelopes.

The cycle time for a communication bus may be based on wire pitch, repeater sizes and worst-case switching activity. Worst-case switching activity for a communication path such as, by way of example and not by way of limitation, on an unshielded static bus, may involve neighboring wires switching simultaneously in opposite direction which may result in maximizing the Miller Coupling Factor for inter-wire coupling capacitance.

BRIEF DESCRIPTION OF THE DRAWINGS

The subject matter regarded as embodiments of the invention is particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

Figure 1:
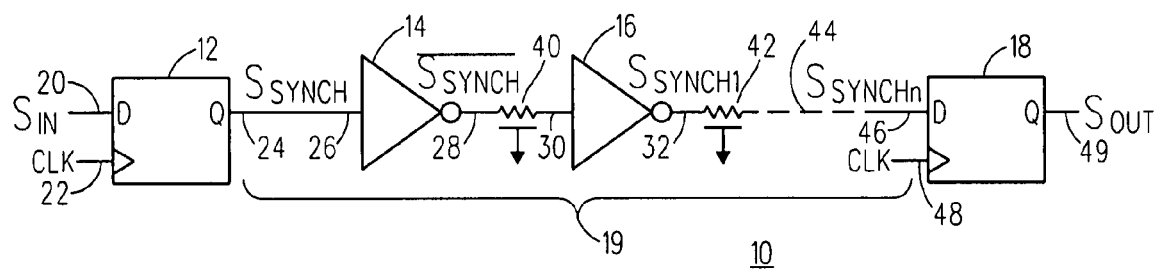
FIG. 1 illustrates a representative communication path.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of embodiments of the invention. However, it will be understood by those skilled in the art that embodiments of the invention may be practiced without these specific details. In other instances, well-known methods, procedures, components and circuits have not been described in detail so as not to obscure embodiments of the invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

FIG. 1 illustrates a representative communication path. In FIG. 1, a signal handling apparatus 10 may include a first flip-flop device 12 and a second flip-flop device 18 coupled by a communication network 19. Communication network 19 may include a first inverter apparatus 14, a second inverter apparatus 16 and communication paths 40, 42. Additional inverter devices and communication paths may be provided between first flip-flop device 12 and second flip-flop device 18 (indicated by a broken line segment 44 in FIG. 1).

First flip-flop device 12 may receive an input signal $S_{IN}$ at a data input locus 20 and may receive a clock signal CLK at a clock input locus 22. First flip-flop device 12 may present a signal $S_{Synch}$ at an output locus 24. Signal $S_{Synch}$ may be synchronized to a particular edge of clock signal CLK such as, by way of example and not by way of limitation, a rising edge of clock signal CLK.

First inverter device 14 may have an input locus 26 and an output locus 28. Input locus 26 may be coupled with output locus 24 of first flip-flop device 12. First inverter device 14 may receive input signal $S_{Synch}$ from first flip-flop device 12 at input locus 26 and may present an inverted input signal $\overline{S_{Synch}}$ at output locus 28 for transmission on a communication path 40, indicated schematically in FIG. 1.

Second inverter device 16 may have an input locus 30 and an output locus 32. Input locus 30 may be coupled with communication path 40. Second inverter device 16 may receive inverted input signal $\overline{S_{Synch}}$ from communication path 40 at input locus 30 and may present a signal $S_{Synch1}$ at output locus 32 for transmission on a communication path 42. Signal $S_{Synch1}$ may be substantially similar to input signal $S_{Synch}$, but signal $S_{Synch1}$ may be somewhat delayed with respect to $S_{Synch}$ because of delays that may be imparted to signals traversing inverter devices 14, 16. Signal $S_{Synch1}$ presented at output locus 32 may traverse additional elements of communication network 19 (not shown in detail in FIG. 1; indicated by broken line segment 44) to arrive at second flip-flop device 18.

Second flip-flop device 18 may receive a signal $S_{Synchn}$ at a data input locus 46 and may receive clock signal CLK at a clock input locus 48. The encoded signal arriving at data input locus 46 may be referred to as $S_{Synchn}$ because additional circuit elements may be traversed in communication network 19. Signal $S_{Synchn}$ may be generally in phase, but delayed, with respect to input signal $S_{IN}$ if an even number of inverter devices are traversed in communication network 19. Signal $S_{Synchn}$ may be generally out of phase but delayed, with respect to encoded input signal $S_{IN}$ if an odd number of inverter devices are traversed in communication network 19. Second flip-flop device 18 may present an output signal $S_{OUT}$ at an output locus 49.

Figure 2:
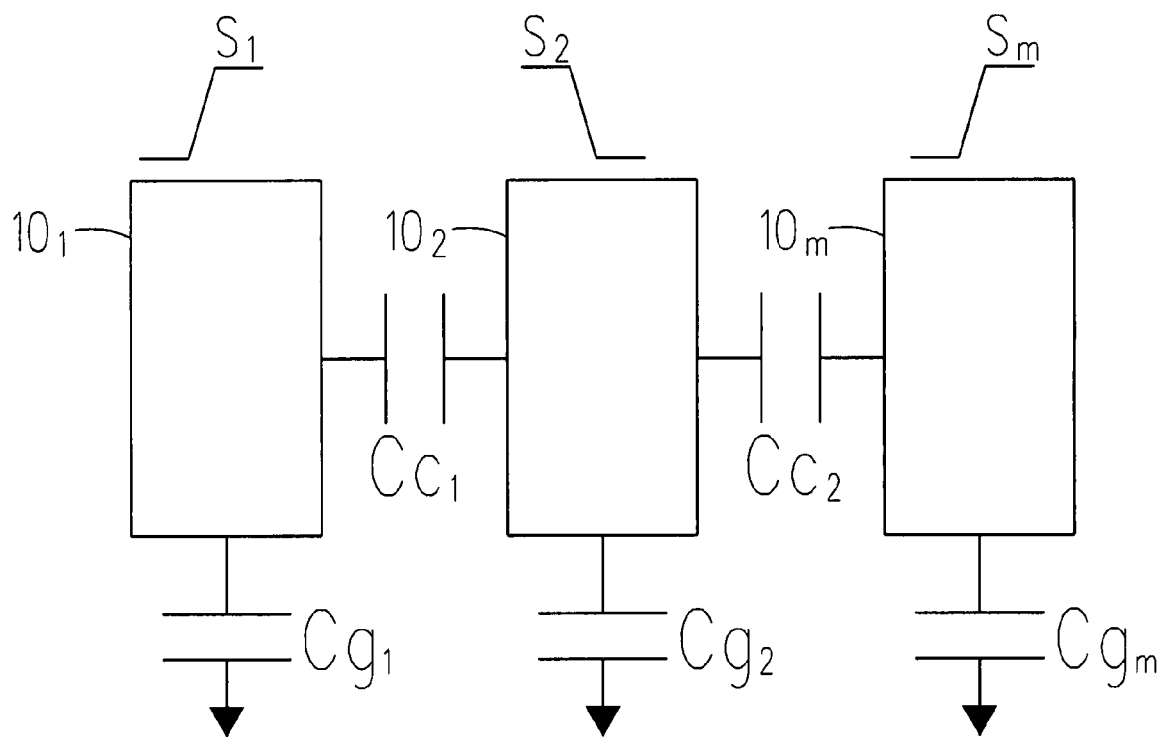
FIG. 2 illustrates a representative plurality of neighboring communication paths.

FIG. 2 illustrates a representative plurality of neighboring communication paths. In FIG. 2, neighboring communication paths $10_1$, $10_2$, $10_m$ may be arranged in a generally parallel relation. The indicator "m" is employed to signify that there can be any number of communication paths in parallel. The inclusion of three communication paths $10_1$, $10_2$, $10_m$ in FIG. 2 is illustrative only and does not constitute any limitation regarding the number of communication paths that may be arranged in parallel when using embodiments of the invention.

Each of communication paths $10_1$, $10_2$, $10_m$ may embody a respective signal handling apparatus 10 configured generally as described in connection with FIG. 1. As one skilled in the art of circuit layout may be aware, parallel communication paths, such as communication paths $10_1$, $10_2$, $10_m$ may experience a respective in-line capacitance Cg, indicated schematically as in-line capacitances $Cg_1$, $Cg_2$, $Cg_m$. As one skilled in the art of circuit layout may also be aware, parallel communication paths, such as communication paths $10_1$, $10_2$, $10_m$ may experience coupling capacitance between adjacent communication paths, such as a coupling capacitance $Cc_1$ between communication paths $10_1$, $10_2$, and a coupling capacitance $CC_2$ between communication paths $10_2$, $10_m$.

Increased capacitance in a communication path may slow communication of signals by that communication path. The slowing effect of coupling capacitors $CC_1$, $CC_2$ may vary depending upon the relative phases of adjacent signals in respective communication paths $10_1$, $10_2$, $10_m$. An illustrative signal phase for a signal $S_1$ may be illustrated as being present in communication path $10_1$. An illustrative signal phase for a signal $S_2$ may be illustrated as being present in communication path $10_2$. An illustrative signal phase for a signal $S_m$ may be illustrated as being present in communication path $10_m$.

If, by way of example and not by way of limitation, two adjacent communication paths $10_1$, $10_2$ may convey signals $S_1$, $S_2$ substantially 180 degrees out of phase, a worst case capacitive coupling case may be presented, and communication in each of communication paths $10_1$, $10_2$ may be slowed.

Efficiency of a communication path may be significantly affected by coupling capacitance, and it may be advantageous to reduce occurrences of worst-case capacitive coupling between communication paths.

Figure 3:
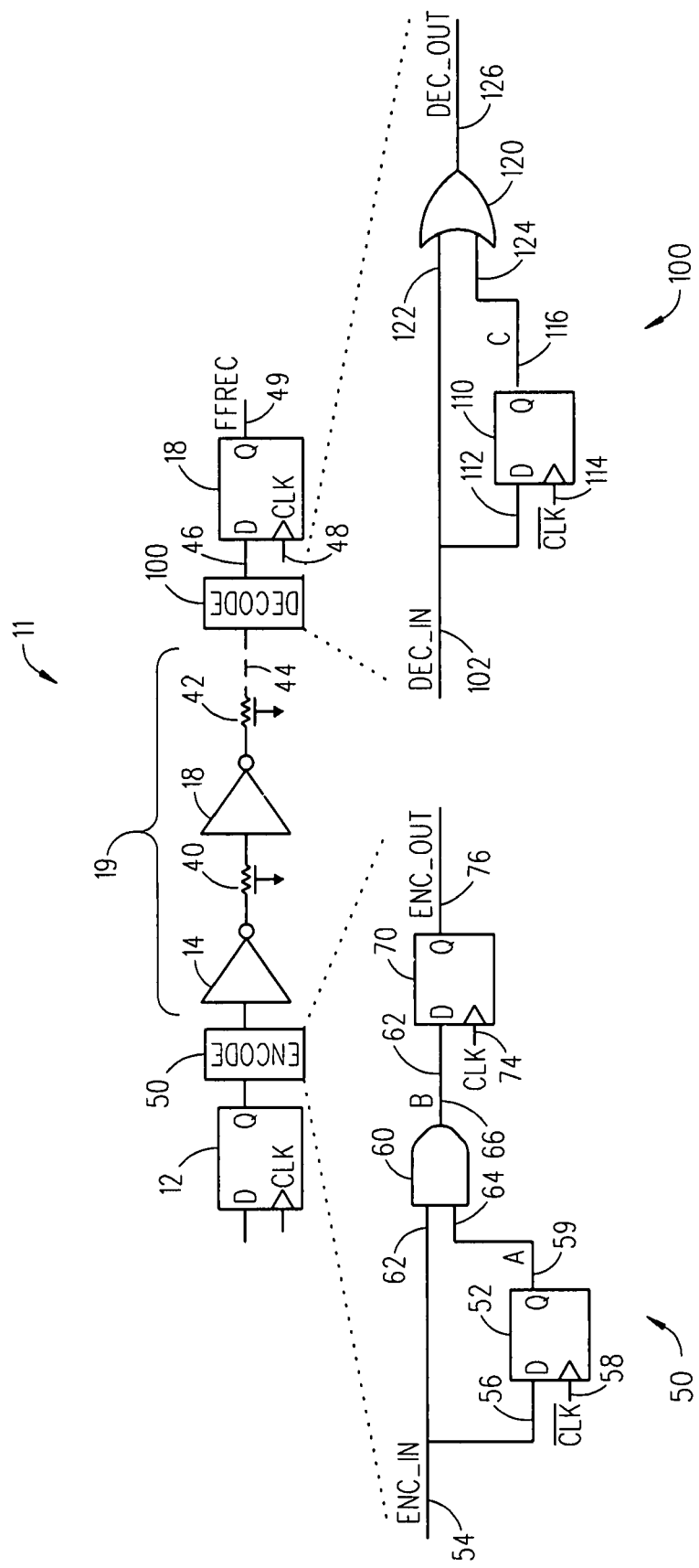
FIG. 3 is a schematic diagram of apparatuses for treating a signal and for decoding a treated signal.

FIG. 3 is a schematic diagram of apparatuses for treating a signal and for decoding a treated signal In FIG. 3, a signal handling apparatus 11 may be illustrated in a configuration similar to signal handling apparatus 10 (FIG. 1). Signal handling apparatus 11 may include flip-flop devices 12, 18, inverter devices 14, 16 and a communication network 19 generally as described in connection with FIG. 1. In the interest of avoiding prolixity, details of signal handling apparatus 11 that are similar to signal handling apparatus 10 will not be repeated here. Signal handling apparatus 11 also may include an encoding treatment unit 50 and a decoding treatment unit 100.

Encoding treatment unit 50 may be coupled with first flip-flop device 12 for receiving a signal ENC_IN at an input locus 54. Encoding treatment unit 50 may include flip-flop devices 52, 70 and an AND logic device 60. Flip-flop device 52 may receive signal ENC_IN at a data input locus 56 and may receive an inverted clock signal $\overline{CLK}$ at a clock input locus 58. Flip-flop device 52 may present a signal A at an output locus 59.

AND logic device 60 may have input loci 62, 64 and an output locus 66. Input locus 64 may be coupled with output locus 59 of flip-flop device 52. AND logic device 60 may receive signal A from flip-flop device 52 at input locus 64. AND logic device 60 may receive signal ENC_IN at input locus 62. AND logic device 60 may present a signal B at output locus 66.

Flip-flop device 70 may receive signal B at a data input locus 72 and may receive clock signal CLK at a clock input locus 74. Flip-flop device 70 may present an output signal ENC_OUT at an output locus 76 for provision to inverter device 14. Flip-flop device 70 may be a double-edge flip-flop device.

Decoding treatment unit 100 may be coupled with communication path 19 for receiving a signal DEC_IN at an input locus 102. Encoding treatment unit 100 may include flip-flop device 110 and an OR logic device 120. Flip-flop device 110 may receive signal DEC_IN at a data input locus 112 and may receive an inverted clock signal $\overline{CLK}$ at a clock input locus 114. Flip-flop device 110 may present a signal C at an output locus 116.

OR logic device 120 may have input loci 122, 124 and an output locus 126. Input locus 124 may be coupled with output locus 116 of flip-flop device 110. OR logic device 10 may receive signal C from flip-flop device 110 at input locus 124. OR logic device 120 may receive signal DEC_IN at input locus 122. OR logic device 120 may present a signal DEC_OUT at output locus 126 for provision to flip-flop device 18.

Flip-flop device 18 may receive signal DEC_OUT at a data input locus 46 and may receive clock signal CLK at a clock input locus 48. Flip-flop device 18 may present an output signal FFREC at an output locus 49.

Figure 4:
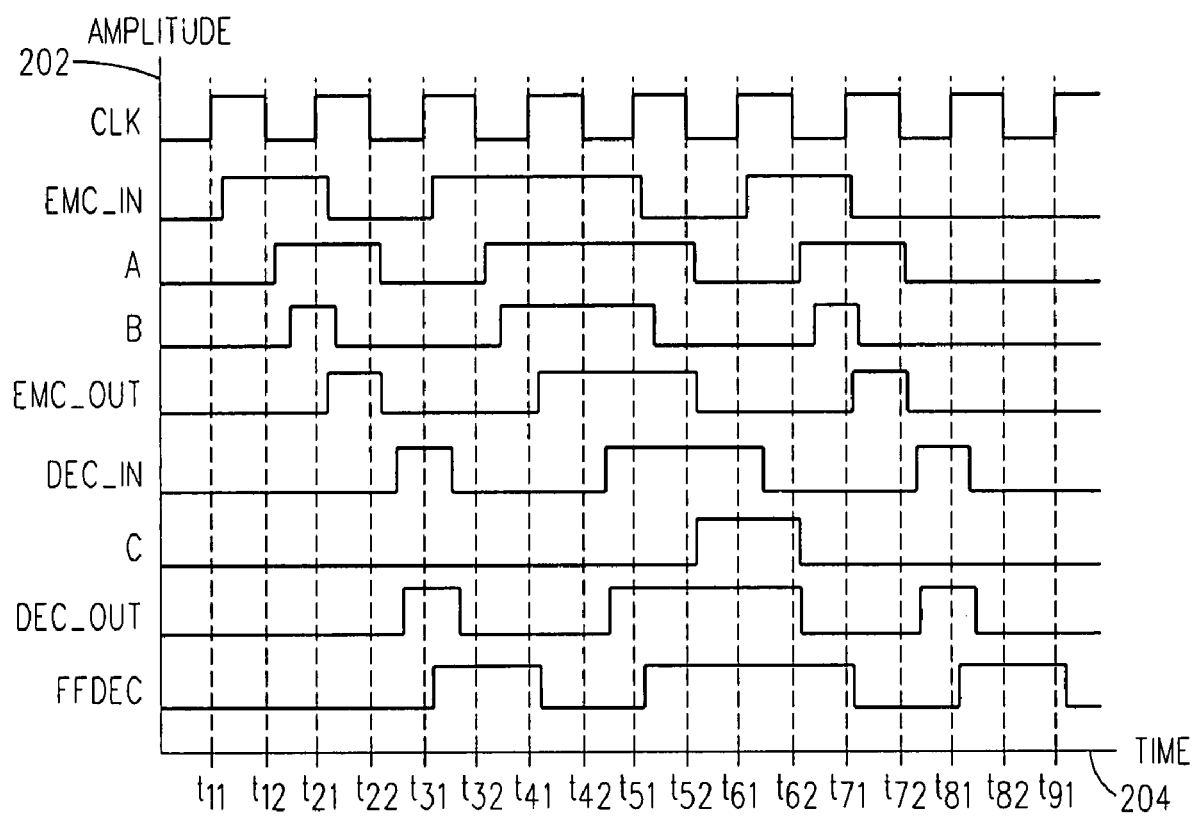
FIG. 4 is a timing diagram relating to various signals described in connection with FIG. 3.

FIG. 4 is a timing diagram relating to various signals described in connection with FIG. 3. In FIG. 4, a graphic plot 200 is presented with respect to a vertical axis 202 representing signal amplitude and a horizontal axis representing time. Various signals described in connection with FIG. 3 are represented in FIG. 4: CLK, ENC_IN, A, B, ENC_OUT, DEC_IN, C, DEC_OUT and FFREC.

Clock signal CLK may be arranged to define a plurality of clock cycles, each clock cycle having two clock phases. Thus, clock signal CLK may define a first clock cycle during a time interval $t_{11}$-$t_{21}$ having a first clock phase during a time interval $t_{11}$-$t_{12}$ and a second clock phase during a time interval $t_{12}$-$t_{21}$. Clock signal CLK may define a second clock cycle during a time interval $t_{21}$-$t_{31}$ having a first clock phase during a time interval $t_{21}$-$t_{22}$ and a second clock phase during a time interval $t_{22}$-$t_{31}$. Clock signal CLK may define a third clock cycle during a time interval $t_{31}$-$t_{41}$ having a first clock phase during a time interval $t_{31}$-$t_{32}$ and a second clock phase during a time interval $t_{32}$-$t_{41}$. Clock signal CLK may define a fourth clock cycle during a time interval $t_{41}$-$t_{51}$ having a first clock phase during a time interval $t_{41}$-$t_{42}$ and a second clock phase during a time interval $t_{42}$-$t_{51}$. Clock signal CLK may define a fifth clock cycle during a time interval $t_{51}$-$t_{61}$ having a first clock phase during a time interval $t_{51}$-$t_{52}$ and a second clock phase during a time interval $t_{52}$-$t_{61}$. Clock signal CLK may define a sixth clock cycle during a time interval $t_{61}$-$t_{71}$ having a first clock phase during a time interval $t_{61}$-$t_{62}$ and a second clock phase during a time interval $t_{62}$-$t_{71}$. Clock signal CLK may define a seventh clock cycle during a time interval $t_{71}$-$t_{81}$ having a first clock phase during a time interval $t_{71}$-$t_{72}$ and a second clock phase during a time interval $t_{72}$-$t_{81}$. Clock signal CLK may define an eighth clock cycle during a time interval $t_{81}$-$t_{91}$ having a first clock phase during a time interval $t_{81}$-$t_{82}$ and a second clock phase during a time interval $t_{82}$-$t_{91}$.

Inverted clock signal $\overline{CLK}$ described in FIG. 3 is not illustrated in FIG. 4. One skilled in the art of circuit design may understand that inverted clock signal $\overline{CLK}$ may be represented by a 180 degree inversion of clock signal CLK.

Regarding FIGS. 3 and 4 together, signal ENC_IN may be applied to encoder treatment unit 50 at input loci 56, 62 and may have a duration of substantially one clock cycle (two clock phases). Signal ENC_IN may exhibit an excursion from a nominal value (e.g., zero) in a positive direction following time $t_{11}$ and may exhibit an excursion in a negative direction following time $t_{21}$ to return to its nominal value. Flip-flop device 52 may respond to receiving signals ENC_IN and $\overline{CLK}$ to generate signal A. Signal A may exhibit a positive excursion from a nominal value (e.g., zero) following time $t_{12}$. Signal A may be synchronized with a rising edge of signal $\overline{CLK}$. Signal A may exhibit an excursion in a negative direction following time $t_{22}$ to return to its nominal value at the first positive excursion of signal CLK after signal ENC_IN exhibits a negative excursion.

AND logic device 60 may respond to receiving signals ENC_IN and A to generate signal B exhibiting a positive excursion from a nominal value (e.g., zero) following time $t_{12}$ (when both of signals A and ENC_IN may be positive). Signal B may exhibit an excursion in a negative direction following time $t_{22}$ to return to its nominal value after signal ENC_IN exhibits a negative excursion.

Flip-flop device 70 may respond to receiving signals B and CLK to generate signal ENC_OUT. Signal ENC_OUT may be synchronized to every clock edge of clock signal CLK, and may take on the value of signal B at each clock edge. Thus, signal ENC_OUT may exhibit a positive excursion from a nominal value (e.g., zero) following time $t_{21}$, and signal ENC_OUT may exhibit an excursion in a negative direction following time $t_{22}$ to return to its nominal value. Signal ENC_IN from flip-flop device 12 is thus treated by encoding treatment unit 50 to present a treated signal ENC_OUT for transmission via communication network 19.

Encoding treatment unit 50 thus may present a treated signal ENC_OUT that may have a positive excursion delayed one clock cycle (two clock phases) with respect to positive excursion of original signal ENC_IN, and may have a negative excursion delayed one clock phase with respect to negative excursion of original signal ENC_IN.

Unequal delays imposed upon positive excursions and negative excursions of signal ENC_IN to present treated signal ENC_OUT may assure that adjacent communication paths $10_1$, $10_2$, $10_m$ (FIG. 2) will never experience a worst case capacitive coupling condition because 180 degree out of phase encoded signals may not appear on respective communication networks 19 of various communication paths $10_1$, $10_2$, $10_m$ (FIG. 2).

An evaluation of positive excursions of signal ENC_IN occurring during time intervals $t_{31}$-$t_{51}$ and $t_{61}$-$t_{71}$ may reveal a similar treatment of signal ENC_IN to present an associated signal ENC_OUT.

If communication delay between output locus 76 and input locus 102 (FIG. 3) may be assured to be greater than one clock phase, flip-flop device 18 may be able to accurately decode signal ENC_OUT. Accurate decoding of signal ENC_OUT or signal DEC_IN to assure faithful reproduction of information indicated by signal ENC_IN may be better assured by using decoding treatment unit 100.

Signal DEC_IN may be received by decoding treatment unit 100 from communication network 19 at an input locus 102. Signal DEC_IN may be related to signal ENC_OUT after signal ENC_OUT traverses communication network 19. While traversing communication network 19 signal ENC_OUT may experience phase delays and signal inversions as described earlier herein in connection with signals $S_{Synch1}$, $S_{Synchn}$ (FIG. 1). Signal DEC_IN may be similar in amplitude and duration to signal ENC_OUT but delayed with respect to signal ENC_OUT. Signal DEC_IN may exhibit an excursion from a nominal value (e.g., zero) in a positive direction following time $t_{22}$ and may exhibit an excursion in a negative direction following time $t_{31}$ to return to its nominal value. Flip-flop device 110 may respond to receiving signals DEC_IN and $\overline{CLK}$ to generate signal C exhibiting a positive excursion from a nominal value (e.g., zero) following time $t_{52}$ (when both of signals $\overline{CLK}$ and DEC_IN may be positive). Signal C may be synchronized to a rising edge of clock signal $\overline{CLK}$. Signal C may exhibit an excursion in a negative direction following time $t_{62}$ to return to its nominal value at the first positive excursion of signal $\overline{CLK}$ after signal DEC_IN exhibits a negative excursion.

OR logic device 120 may respond to receiving signals DEC_IN and C to generate signal DEC_OUT exhibiting a positive excursion from a nominal value (e.g., zero) following time $t_{22}$, following time $t_{42}$ and following time $t_{72}$ (when either one of signals C and DEC_IN may be positive). Signal C may exhibit an excursion in a negative direction following time $t_{62}$ to return to its nominal value after signal DEC_IN exhibits a negative excursion. Signal C may also be synchronized to a rising edge of clock signal $\overline{CLK}$. Signal DEC_IN received from communication network 19 may thus be treated by decoding treatment unit 100 to present a decoded signal DEC_OUT for use by flip-flop device 18.

Flip-flop device 18 may respond to receiving signals DEC_OUT and CLK to generate signal FFREC exhibiting a positive excursion from a nominal value (e.g., zero) following time $t_{31}$ (when both of signals DEC_OUT and CLK may be positive). Signal FFREC may be synchronized to a rising edge of clock signal CLK. Signal FFREC may exhibit an excursion in a negative direction following time $t_{41}$ to return to its nominal value at the first positive excursion of signal CLK after signal DEC_OUT exhibits a negative excursion. Signal FFREC may substantially faithfully represent signal DEC_IN as to periodicity of beginnings of excursions, with some clock phase delays. Signal FFREC may substantially faithfully represent signal ENC_IN with some delay.

Figure 5:
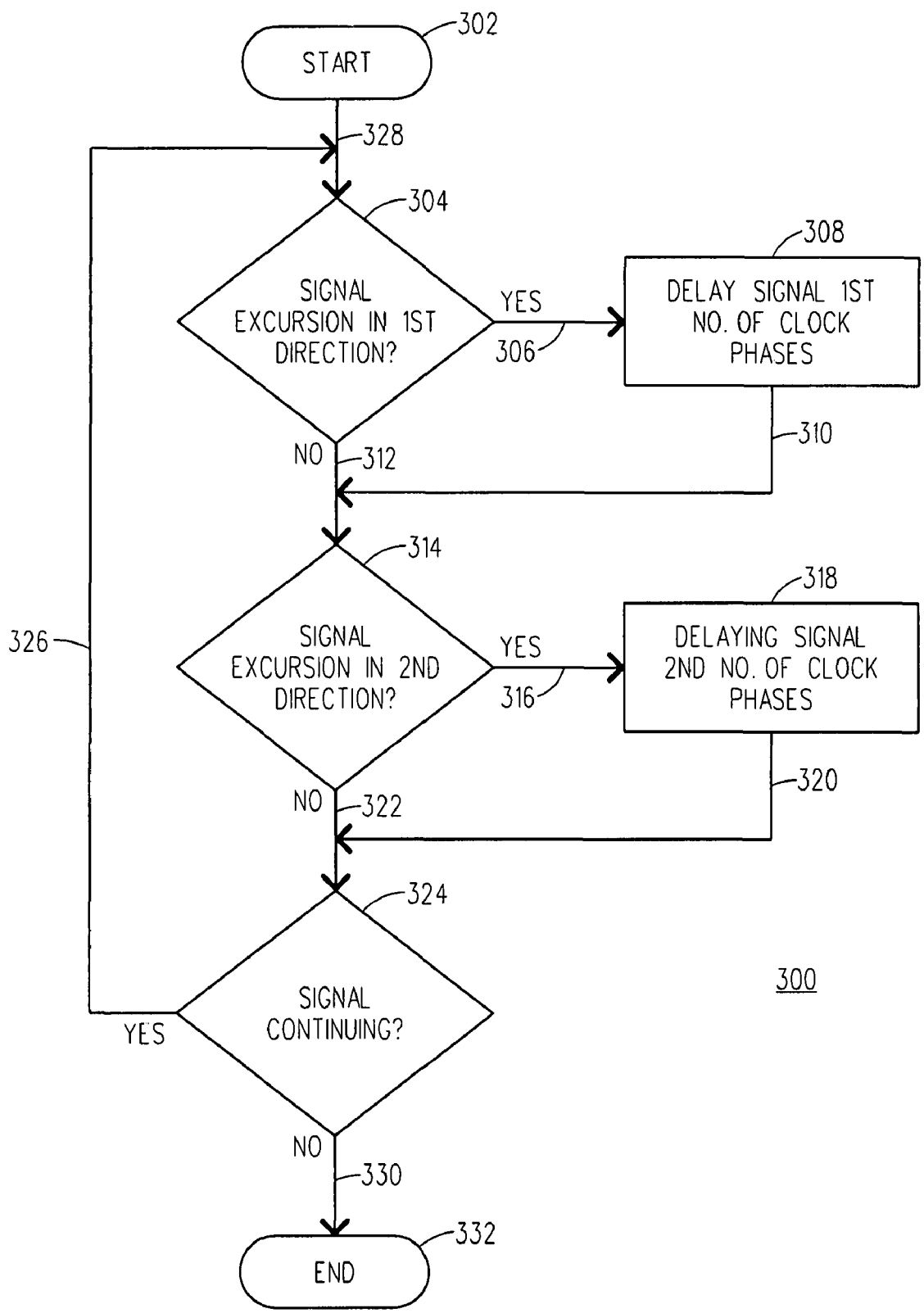
FIG. 5 is a flow chart illustrating an embodiment of the method of the invention.

FIG. 5 is a flow chart illustrating an embodiment of the method of the invention. In FIG. 5, a method 300 may be used with a signal effecting a plurality of succeeding excursions departing from a value and returning to the value in a pattern in substantial synchrony with a clocked signal presenting succeeding clock cycles having a plurality of clock phases in each respective clock cycle. Method 300 may begin at a START locus 302. Method 300 may continue by posing a query whether the signal has exhibited a signal excursion in a first direction, as indicated by a query block 304. If the signal has exhibited a signal excursion in a first direction, method 300 may continue from query block 304 via a YES response line 306 to delay a respective excursion of the signal a first number of clock phases, as indicated by a block 308.

Method 300 may continue, as indicated by a line 310, by posing a query whether the signal has exhibited a signal excursion in a second direction, as indicated by a query block 314. If the signal has not exhibited a signal excursion in a second direction, method 300 may proceed from query block 304 via a NO response line 312 directly to query block 314. If the encoded signal has exhibited a signal excursion in a second direction, method 300 may continue from query block 314 via a YES response line 316 to delay a respective excursion of the encoded signal a second number of clock phases, as indicated by a block 318. The second number of clock phases may not equal the first number of clock phases.

Method 300 may continue, as indicated by a line 320, by posing a query whether the encoded signal continues, as indicated by a query block 324. If the encoded signal has not exhibited a signal excursion in a second direction, method 300 may proceed from query block 314 via a NO response line 322 directly to query block 324. If the encoded signal continues, method 300 may proceed from query block 324 via a YES response line 326 to a locus 328 to repeat steps represented by blocks 304, 308, 314, 318, 324. If the encoded signal does not continue, method 300 may proceed from query block 324 via a NO response line to terminate, as indicated by an END locus 332.

Embodiments of the method and apparatus permit treating a signal prior to transmission to reduce inter-path coupling capacitance between neighboring communication paths. While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method comprising:
    delaying a first excursion of at least one signal a first number of clock phases in response to said first excursion being an excursion of the at least one signal in a positive direction; and
    delaying a second excursion of said at least one signal a second number of said clock phases in response to said second excursion being an excursion of the at least one signal in a negative direction;
    wherein said first number of clock phases is different from said second number of clock phases; and
    said at least one signal comprises a plurality of excursions including at least the first excursion in the positive direction and the second excursion in the negative direction, based on a clocked signal presenting succeeding clock cycles having a plurality of said clock phases in each respective clock cycle.

2. The method of claim 1, further comprises:
    reproducing selected recovered edges of at least one selected signal of said at least one signal in at least one reproduced signal;
    wherein each said at least one reproduced signal substantially replicates an edge pattern of a corresponding selected signal of said at least one selected signal; and
    each said respective at least one reproduced signal is delayed with respect to said corresponding selected signal by at least said first number of clock phases.

3. The method of claim 1, wherein said second number of clock phases is greater than said first number of clock phases.

4. The method of claim 3, wherein each respective said clock cycle has two clock phases.

5. The method of claim 1, wherein each respective said clock cycle has two clock phases.

6. The method of claim 1, wherein each respective said clock cycle has two clock phases, wherein said second number of clock phases is two clock phases and wherein said first number of clock phases is one clock phase.

7. The method of claim 6, wherein said at least one signal is a plurality of signals traversing generally parallel communication paths.

8. An apparatus comprising:
    an input locus configured to receive at least one signal, wherein said at least one signal comprises a plurality of excursions including at least a first excursion and a second excursion, based on a clock signal presenting succeeding clock cycles having a plurality of clock phases in each respective clock cycle;
    a treating unit coupled to the input locus configured to generate at least one treated signal, wherein said at least one treated signal is delayed with respect to said at least one signal at least a first number of said clock phases in response to the first excursion being an excursion of the at least one signal in the positive direction and at least a second number of said clock phases in response to the second excursion being an excursion of the at least one signal in the negative direction; said first number of clock phases being different from said second number of clock phases.

9. The apparatus of claim 8, wherein the apparatus further comprises:
    a decoding unit coupled to the treating unit, and configured to receive said treated signal;
    wherein said decoding unit is configured to reproduce selected recovered edges of at least one selected signal of said at least one signal in at least one reproduced signal;
    wherein said at least one reproduced signal substantially replicates an edge pattern of a corresponding selected signal of said at least one selected signal; and
    wherein each said respective at least one reproduced signal is delayed with respect to said corresponding selected signal by at least said first number of clock phases.

10. The apparatus of claim 8, wherein said treating unit comprises:
    (a) at least one first flip-flop unit configured to receive said at least one signal and said clock signal; said at least one first flip-flop unit configured to produce at least one first flip-flop output signal based on said at least one signal and said clock signal;
    (b) at least one AND gate coupled with said at least one first flip-flop unit; said at least one AND gate configured to receive said at least one signal and said at least one first flip-flop signal; said at least one AND gate configured to produce at least one AND output signal based on said at least one signal and said at least one first flip-flop signal; and
    (c) at least one second flip-flop unit coupled with said at least one AND gate; said at least one second flip-flop unit configured to receive said at least one AND output signal and said clock signal; said at least one second flip-flop unit configured to produce said at least one treated signal; said at least one treated signal based on said clock signal and said at least one AND output signal.

11. The apparatus of claim 8, wherein said at least one second flip-flop unit is a double-edge flip-flop unit.

12. The apparatus of claim 8, wherein said at least one second number of clock phases is greater than said first number of clock phases.

13. The apparatus of claim 12, wherein each respective said clock cycle has two clock phases, wherein said second number of clock phases is two clock phases and wherein said first number of clock phases is one clock phase.

14. The apparatus of claim 13, wherein said at least one signal is a plurality of signals traversing generally parallel communication paths.

15. The apparatus of claim 8, wherein each respective said clock cycle has two clock phases.

16. The apparatus of claim 8, wherein said at least one signal is a plurality of signals traversing generally parallel communication paths.

* * * * *